United States Patent
Kikuchi et al.

[11] Patent Number: 6,104,166
[45] Date of Patent: Aug. 15, 2000

[54] METHOD AND DEVICE FOR DETECTING A STATE OF CHARGE OF A BATTERY ASSEMBLY, AND BATTERY ASSEMBLY CHARGE AND DISCHARGE CONTROL DEVICE

[75] Inventors: Yoshiaki Kikuchi; Toshiyuki Sekimori; Fumihiko Asakawa, all of Toyota; Susumu Ukita, Nagoya; Yoshimi Shoji, Takahama; Toshiaki Nakanishi, Toyohashi; Tadao Kimura, Kobe; Tomoya Katoh, Nagoya, all of Japan

[73] Assignees: Toyota Jidosha Kabushiki Kaisha, Toyota; Matsushita Electric Industrial Co., Ltd., Osaka; Denso Corporation, Kariya, all of Japan

[21] Appl. No.: 09/167,490

[22] Filed: Oct. 7, 1998

[30] Foreign Application Priority Data

Oct. 13, 1997 [JP] Japan .................................. 9-278789
Dec. 8, 1997 [JP] Japan .................................. 9-336895

[51] Int. Cl.$^7$ .................................................. H02J 7/00
[52] U.S. Cl. .......................................... 320/132; 320/130
[58] Field of Search .................................. 320/132, 130, 320/120, 104

[56] References Cited

U.S. PATENT DOCUMENTS

| 5,387,857 | 2/1995 | Honda et al. | 320/120 |
| 5,539,318 | 7/1996 | Sasaki | 324/428 |
| 5,650,712 | 7/1997 | Kawai et al. | 320/DIG. 21 |
| 5,786,640 | 7/1998 | Sakai et al. | 320/104 |

FOREIGN PATENT DOCUMENTS

| 0 926 799 A1 | 6/1999 | European Pat. Off. . |
| 93 08 662 | 10/1993 | Germany . |
| 195 40 827 A1 | 5/1996 | Germany . |
| 6-231805 | 8/1994 | Japan . |
| 8-140206 | 5/1996 | Japan . |
| 8-163705 | 6/1996 | Japan . |
| 8-182211 | 7/1996 | Japan . |
| 8-317572 | 11/1996 | Japan . |
| WO 97/17620 | 5/1997 | WIPO . |

*Primary Examiner*—Adolf Deneke Berhane
*Assistant Examiner*—Lawrence Luk
*Attorney, Agent, or Firm*—Oliff & Berridge PLC

[57] ABSTRACT

Variation of the charged amount among battery blocks composing a battery assembly is detected. By subtracting the detected value of the variation from the width between the upper limit value and the lower limit value of the charged amount, the movable range of the charged amount is found. The position of the present charged amount is detected as the state of charge. For example, it is arranged that both ends of the movable range are 0% and 100%, and that the movable range is the full scale. Then, the position of the charged amount on this scale is specified by the ratio %. The detection of the state of charge in which the variation in charged amount and the change of the movable range are considered, is performed, and on the basis of this state of charge, a preferable charge and discharge control is performed.

16 Claims, 12 Drawing Sheets

PRINCIPLE OF PRESENT INVENTION (1)

PRINCIPLE OF PRESENT INVENTION (2) (DETECTION OF VARIATION)

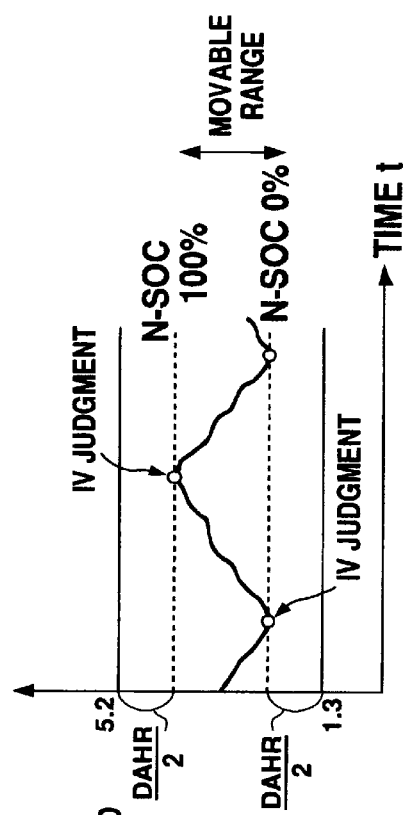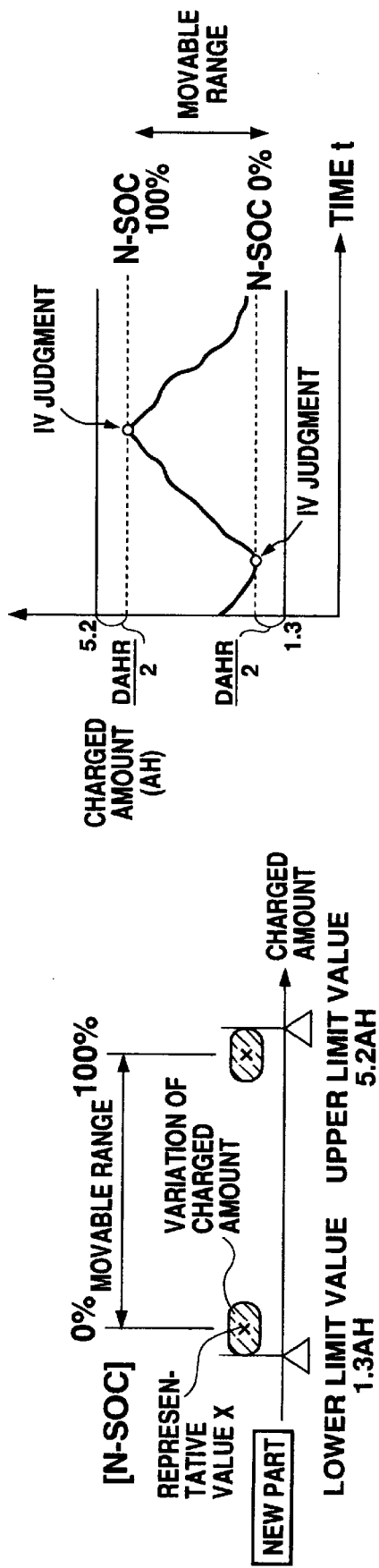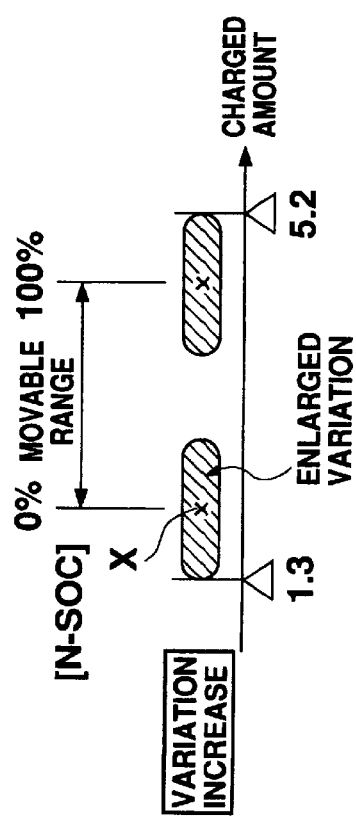

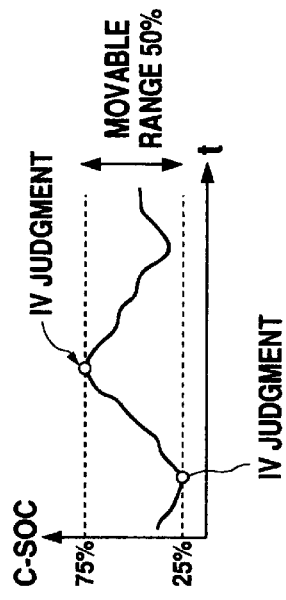
Fig. 11A
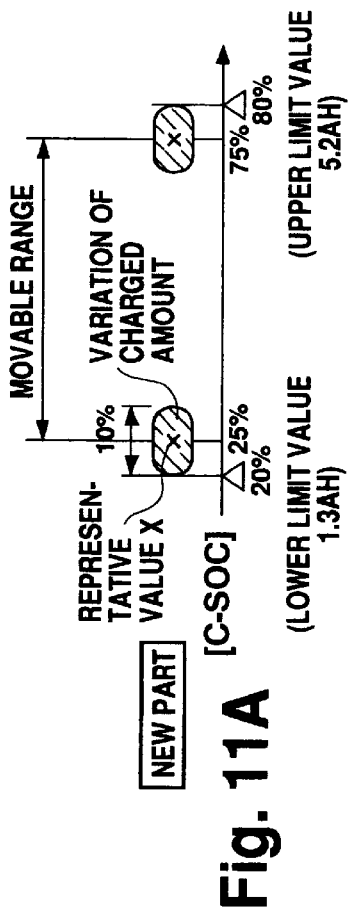
Fig. 11C
Fig. 11E
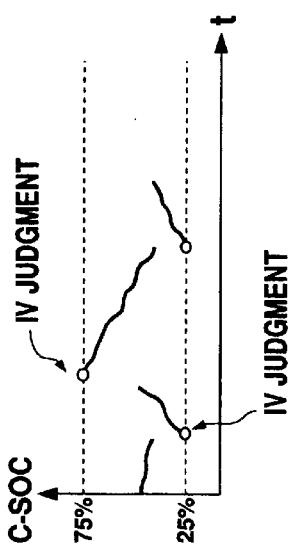
Fig. 11B
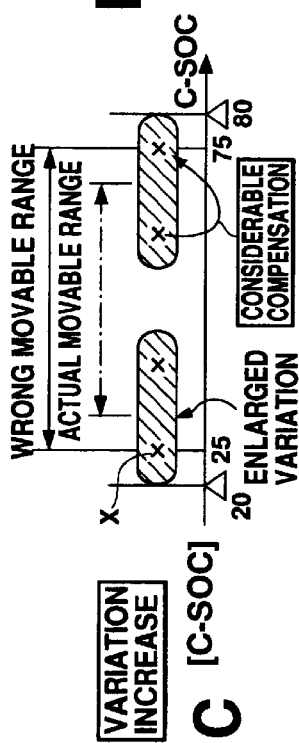
Fig. 11D
Fig. 11F
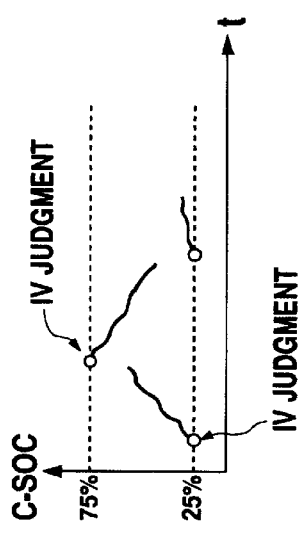
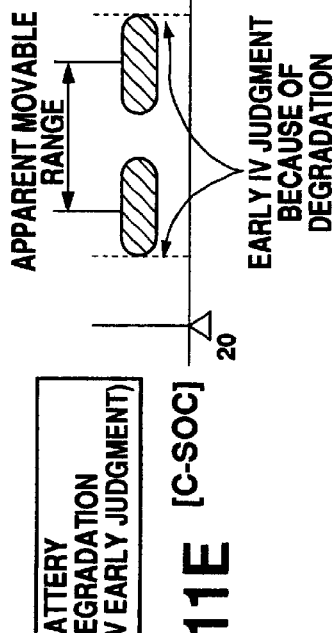

METHOD AND DEVICE FOR DETECTING A STATE OF CHARGE OF A BATTERY ASSEMBLY, AND BATTERY ASSEMBLY CHARGE AND DISCHARGE CONTROL DEVICE

BACKGROUND OF THE INVENTION

1. Field of the Invention

The present invention relates to the detection of the state of charge of a battery assembly, and especially relates to a method and device by which the state of charge can accurately be detected, even if the variation in charged amount among batteries composing a battery assembly becomes large. Furthermore, the present invention relates to a device by which said variation in charged amount can easily be detected.

2. Description of the Related Art

A typical electric motor car in which an electric motor provides the driving force has a secondary battery (hereafter referred to simply as a battery), and the electric motor is driven by the electric power charged in this battery. Here, a hybrid powered automobile which is a type of electric motor car, will be described.

A hybrid powered automobile has an electric motor and a combustion engine, and further includes an electric generator. The electric generator generates electric power by being driven by the combustion engine, and the battery is charged by the thus generated electric power. Furthermore, the battery is also charged during regenerative braking. There may be a case where an electric generator also serves as an electric motor (motor-generator). In a hybrid powered automobile, the charged amount of a battery can freely be controlled by shifting between charge and discharge.

For example, when slowing down on a downhill road or the like, the charged amount is raised by regenerative braking. The combustion engine is then stopped and the vehicle runs by the output power of the electric motor. Thus, by utilizing the electric power obtained by the regenerative braking, a high energy efficiency can be achieved. When it is found that the charged amount is lowering, the electric generator is driven by the output power of the combustion engine, and the generated electric power is charged in the battery.

For the control of the charged amount, previously, SOC (state of charge) has been used as a quantity expressing the charged amount. SOC is the ratio of the occasional charged amount to the charged amount in the state of full charge. SOC is 100% in the state of full charge, and 0% in the state of no charge. It is desirable that SOC be controlled to be a value towards the middle of 100% to 0%, for example, approximately 50 to 60%. If SOC is controlled to be such a value, the battery can sufficiently take in the electric power generated during the regenerative braking, while still being able to immediately supply sufficient electric power to the electric motor according to the request.

Furthermore, in an electric motor car, usually, the upper limit value and the lower limit value of the charged amount are determined. The upper limit value is set considering the charging efficiency, the heat evolution of a battery, and the like. Furthermore, the lower limit value is set considering the electric power necessary during the starting up of the combustion engine, and the like. The charged amount is controlled so as not to exceed either of the upper limit value or the lower limit value.

In an electric motor car, in order to obtain a high voltage, a battery assembly having a number of batteries connected in series is commonly used. The temperature of the batteries composing a battery assembly is not equal, and, especially in the service environment of an automobile or the like, differences in temperatures among batteries arise fairly easily. Furthermore, the full capacity is different for each battery, and the charging efficiency (ratio of the amount of the current to be charged, to the amount of the supplied current) is also different. Therefore, there is a variation in the actual charged amount (rest charged amount, rest capacity) of each battery composing a battery assembly.

Therefore, as shown in FIG. 1, it is arranged to perform control so that the charged amount of any battery composing a battery assembly will not exceed either the upper limit value or the lower limit value. At the upper portion of FIG. 1, the shaded area m shows the range of the variation in charged amount. The charged amount of a battery increases and decreases while keeping the state of the variation. In other words, the area m in FIG. 1 moves leftward and rightward as it is. In order to prevent over discharge and over charge, the charged amount is controlled so that the area m will not protrude out of the upper limit value or the lower limit value. Generally, if the charged amount of any one battery has reached the upper limit value or the lower limit value, respective additional charge or discharge is restrained.

However, the variation in charged amount changes with the elapse of the operating time of a battery, and generally gradually enlarges. Previously, there has been such a problem that as will be described more fully below, that the detection of the charged amount is not properly performed and the control of charge is not properly performed since the change of the variation is not considered.

At the lower portion in FIG. 1, the area m' is the range of the variation in charged amount after being enlarged. It is assumed that charging is performed beginning from the state where area m' is positioned at the left end as shown in the figure. Since the enlargement of the variation is not considered, the charge is controlled on the assumption that the area m' can move rightward by a distance equal to that before the enlargement of the variation. However, this assumption that the area m' can move to the position shown by the dotted line is not correct. Actually, as shown in the figure, the area m' reaches the upper limit value considerably earlier than the expected time. At this time, a rapid shift from charge to discharge is necessary.

Such control negatively effects drivability. In a hybrid powered automobile, the distribution of the driving force between an electric motor and a combustion engine is controlled so that charge and discharge may properly be performed while tracking the amount of charge. If a shift from charge to discharge is suddenly performed, the distribution of the driving force also suddenly shifts, causing the driving force to shift in stages and giving the occupants an uncomfortable feeling. For example, when an active charge is suddenly shifted to discharge, the combustion engine driving the electric generator stops and the motor-generator is shifted from generating mode to driving mode. These problems also arise similarly during the discharge. That is, the occupants may feel discomfort because of a sudden shift from discharge to charge.

These problems arise because the charged amount is not accurately detected. As an example, as shown at the upper portion in FIG. 1, the center of the area m is set to be the representative value X of the charged amount. The position of the representative value X is found by adding one half of the width of the variation (D/2) to the lower limit value of the charged amount when the area m is positioned to the left. However, if the change in variation is not considered, the representative value X is shifted from the center Y of the actual area m' as shown in the lower portion in FIG. 1. Consequently, value X used to represent the charged amount becomes incorrect.

The control target value of the charged amount may be set to, for example, approximately SOC 60%. If the representative value X is wrong, this control target value is not achieved because the center Y (real representative value) exists at different position when the representative value X is SOC 60%.

When the variation becomes large, a further problem arises. At the lower portion of FIG. 1, when the area m' has reached the upper limit value of the charged amount, the representative value X has yet to reach the control target value. Even so, discharge becomes necessary so as to avoid overcharge. This results in that a contradiction arises in control and a suitable control cannot be performed. This phenomenon may arise not only on the charge side but also on the discharge side. In such a case, discharge and charge are repeated without achieving the control target, and consequently, repeated switching between charge and discharge may arise.

As descried above by using a concrete example, if the variation changes, the charged amount is not properly detected, and the control of charge may not properly be performed. In order to avoid such a problem, it can also be considered that the variation theoretically is large. However, approaching the problem in this way results in the upper or lower limits of the charged amount being wastefully limited and in the under utilization of battery performance.

Furthermore, as a related art, there is a battery rest capacity display device described in Japanese Patent Laid-Open Publication No. Hei 8-163705. In said publication, the state of charge is found considering the degradation of a battery. However, the variation in the charged amount of a battery is not considered, and the detected allowance of discharge is not accurate.

Especially, problems such as described above are obvious in a battery having a charging characteristic similar to that of a nickel hydrogen battery (NiMH). IV judgment is a well known SOC detecting system. In IV judgment, SOC is found by using the fact that there is a correlation between the voltage and current of a battery and SOC. However, a nickel hydrogen battery has such a charging characteristic as shown in FIG. 2. The value of the voltage relative to SOC is approximately constant. The voltage largely changes relative to SOC only in the area where SOC is nearly 100% and in the area where SOC is nearly 0%. IV judgment is difficult in the area where the voltage is constant, and the area where the IV judgment can suitably be performed, is limited to the areas of both ends.

Accordingly, IV judgment cannot be used except when the charged amount is the upper limit value, the lower limit value, or a value near one of those values. Because of this limitation, methods wherein the change of the charged amount is traced by integrating the value of the current flowing through a battery are considered. When referring to FIG. 1, the movement of the area m with slanting lines is traced and, consequently, the charged amount is detected. However, during this tracing of the charged amount, as described above, the upper limit value or the lower limit value of the charged amount may be instantly detected by IV judgment. Furthermore, in the representative value X for the tracing of the charged amount, an error according to the change (enlargement) of the variation may arise.

On the other hand, in the above description, it has been explained that there is a variation in charged amount of a battery composing a battery assembly. If the charged amount of each battery is detected, the variation in amount of charge amount can also be found. However, a nickel hydrogen battery has a charging characteristic of FIG. 2. While the battery is used, the amount of charge exists in the state of being scattered in a part where the voltage is constant. Accordingly, the amount of charge cannot be detected by IV judgment. Therefore, for a nickel hydrogen or similar battery having a charging characteristic as shown in FIG. 2, it has been difficult to detect the variation in charged amount while the battery is used.

SUMMARY OF THE INVENTION

An object of the present invention is to provide a method and device by which the state of charge of a battery assembly can properly be detected considering the change of the variation in charged amount. Another object of the present invention is to provide a charge and discharge control device by which proper charge and discharge control are possible.

Furthermore, another object of the present invention is to a device to detect the state of charge by which the variation in charged amount can easily be detected.

This detecting method of the state of charge of the present invention is a method for detecting the state of charge of a battery assembly with a plurality of battery cells connected in series, comprising: a variation detecting step of detecting the variation in charged amount among a plurality of battery blocks composing said battery assembly and including 1 or more pieces of said battery cells in each block; a movable range calculating step of calculating the movable range of the charged amount, on the basis of the detected value of the variation and the upper and lower limit values of the charged amount of said battery blocks; and a step of detecting, as a state of charge, where in said movable range the present charged amount is positioned.

The state of charge found in this way reflects the change of the variation, and accurately shows the positioning of the charged amount in the present and actual movable range. Accordingly, if the charged amount and the charge and discharge are controlled by using the state of charge of the present invention, the charged amount can smoothly be changed with the movable range considering the present and actual movable range. Various problems caused by not considering the change of the variation, are thereby avoided.

The state of charge detecting device of the present invention is a device for detecting the state of charge of a battery assembly with a plurality of battery cells connected in series, comprising a variation detecting means for detecting the variation in charged amount among a plurality of battery blocks composing said battery assembly and including 1 or more pieces of said battery cells in each block, and a movable range calculating means for calculating the movable range of the charged amount on the basis of the detected value of the variation and the upper and lower limit values of the charged amount of said battery blocks, and it detects, as a state of charge, where in said movable range the present charged amount is positioned. It may be preferable that the ratio of the charged amount on the scale to the full scale when said movable range is made to be the full scale, is found as a state of charge.

The state of charge detecting device of further aspect of the present invention is a device which can detect the variation in charged amount among a plurality of battery blocks composing a battery assembly and including 1 or more battery cells in each block. This detecting device comprises: a means for detecting, as a first judging time, the time when the charged amount of a battery block with the minimum charged amount has reached the first judgment value; a means for detecting, as a second judging time, the time when the charged amount of a battery block with the maximum charged amount has reached the second judgment value; a charge and discharge amount measuring means for measuring the amount of charge and discharge between the first judging time and the second judging time; and a variation calculating means for calculating the variation in charged amount among battery blocks on the basis of the first judgment value and the second judgment value and the measured value of the amount of charge and discharge.

While it has previously been necessary to know the charged amounts of all blocks in order to find the variation in charged amount, the variation in charged amount can easily be found even if the charged amounts of all blocks are not known, according to the present invention. Especially, the present invention may be suitably applied to a type of battery, such as a NiMH battery, in which the value of the voltage relative to the charged amount is constant over a wide range.

Preferably, a temperature detecting means for detecting the battery temperature may be included, and the calculation of the variation of said charged amount by using said measured value of the amount of charge and discharge is prohibited when the battery temperature, at least at either time of said first judging time or said second judging time, is not in a specified range of temperature. When the battery is in a state of high temperature or in a state of low temperature, the accuracy of judging that the charged amount has reached the first judgment value or the second judgment value is lowered and, if such a judgment result is used the error of the detected value of the state of charge increases. According to the present invention, when the battery temperature during said judgment is in the range of temperature where the judgment accuracy is low, calculation of the variation in charged amount is not performed, so that the accuracy in detection of the variation can be improved, and accordingly, the accuracy in detection of the state of charge can also be improved.

Furthermore, a charge and discharge control device of the present invention may be in the form of a device for controlling the charge and discharge of a battery assembly with a plurality of battery cells connected in series, comprising a variation detecting means for detecting the variation in charged amount among a plurality of battery blocks composing said battery assembly and including 1 or more pieces of said battery cells in each block, and a movable range calculating means for calculating the movable range of the charged amount on the basis of the detected value of the variation and the upper and lower limit values of the charged amount of said battery blocks, and it controls the amount of charge and discharge to the battery assembly so that the charged amount may be in said movable range.

The movable range of said charged amount calculated by said movable range calculating means, may be enlarged by a specified timing. The movable range calculated by the movable range calculating means may be more narrow than the actual movable range because of factors such as various types of detection errors or the environment where the battery is used. If the detection result of the movable range having such an error is used, the total of the real movable range cannot be utilized for the charge and discharge control. According to the present invention, the detection error of the movable range is corrected by the enlarging control of the movable range, so that the movable range used for the control can be brought near the actual movable range and, therefore, the battery can perform more efficiently. If the movable range is excessively enlarged, the detection of the variation may be performed again.

When the movable range of said charged amount is enlarged, the size of said movable range may be restricted so as not to exceed a specified maximum value. By setting the maximum value of the movable range, an excessive enlargement is avoided and a proper control is performed.

Furthermore, the charge and discharge control device of another aspect of the present invention is a device for controlling the charge and discharge of a battery assembly with a plurality of battery cells connected in series, comprising a judging means for judging that the charged amount has reached the upper limit value or the lower limit value for each of a plurality of battery blocks composing said battery assembly and including 1 or more pieces of said battery cells in each block, and a movable range calculating means for finding, as a movable range of the charged amount, the range of the charged amount between the state where the charged amount of a battery block with the minimum charged amount has reached the lower limit value and the state where the charged amount of a battery block with the maximum charged amount has reached the upper limit value, and it controls the amount of charge and discharge to the battery assembly so that the charged amount may be in said movable range. The control device of this mode may comprise an ammeter for detecting the current flowing through the battery assembly and a voltmeter for measuring the voltage of each battery block, and said judging means judges that the charged amount of a battery block has reached the upper limit value or the lower limit value by IV judgment based on the detected value of the current and the detected value of the voltage.

Furthermore, the position of said charged amount within said movable range may be calculated on the basis of the amount of charge and discharge found by accumulating the detected values of the current.

Still further, the battery cell composing said battery assembly may be a nickel hydrogen battery, and the upper limit value and the lower limit value of the charged amount may be set in the area where the amount of change of the voltage relative to the charged amount is not constant and said IV judgment can suitably be performed.

As described above, the present invention is especially suitably applicable to a battery, such as a nickel hydrogen battery, in which the value of the voltage relative to the charged amount is constant over a wide range. Furthermore, when this invention is applied to a hybrid powered automobile, the control device which controls an electric motor, an electric generator, and a combustion engine while monitoring the state of charge, functions as the total or a part of the charge and discharge control device, for a battery.

BRIEF DESCRIPTION OF THE DRAWINGS

FIG. 10A to FIG. 10D are figures showing the charge and discharge control when the amount of the state of charge N-SOC of the present embodiment is applied;

FIG. 11A to FIG. 11F are figures showing the charge and discharge control when the conventional amount of the state of charge C-SOC is applied and the change of the variation of the charged amount is not considered.

DESCRIPTION OF PREFERRED EMBODIMENTS

Figure 3:
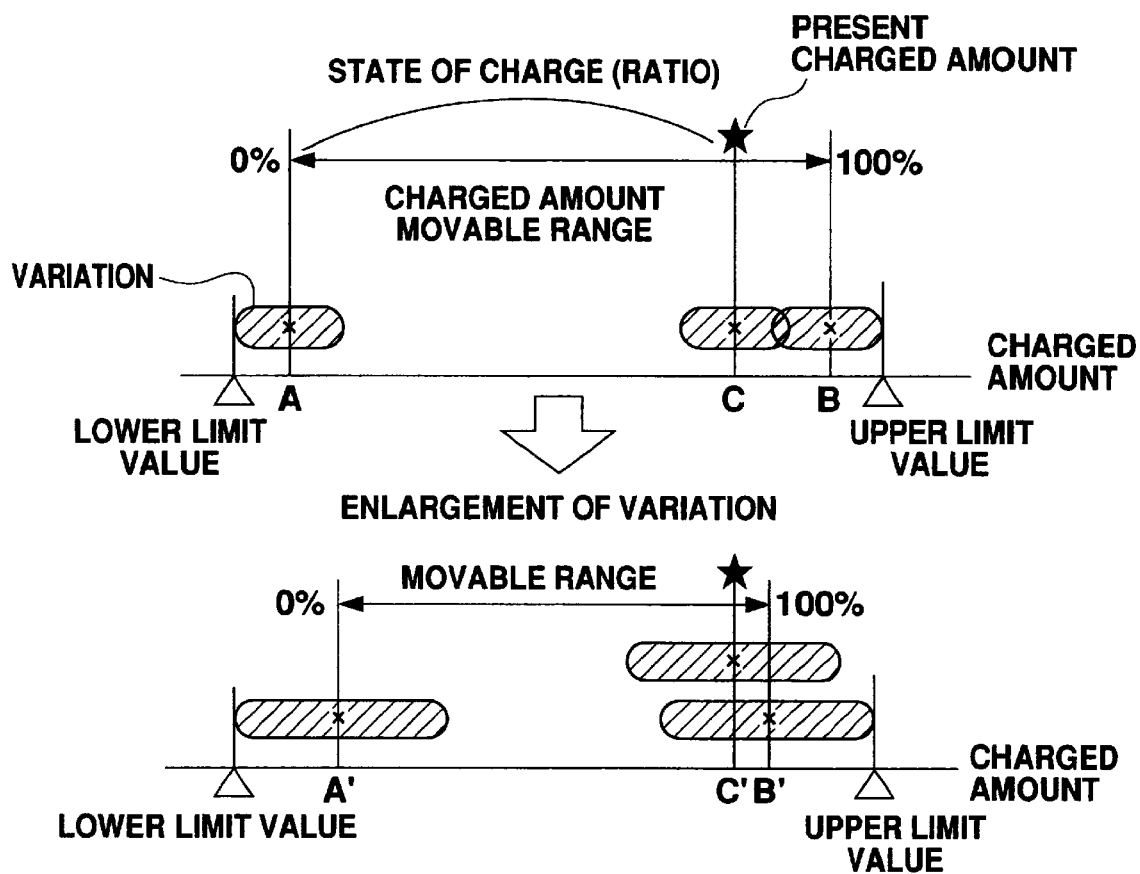
FIG. 3 is a figure explaining the detection of the state of charge of a battery as the principle of the present invention.

FIG. 3 shows the principle of the detection of the state of charge of the present invention. In the present invention, as shown in FIG. 3, the variation (indicated by slanting lines) in charged amount among battery blocks composing a battery assembly is detected. By subtracting the detected value of the variation from the width between the upper limit value and the lower limit value of the charged amount, the movable range (A~B) of the charged amount is found. Here, "movable range" refers to a range in which the charged amount can increase and decrease without making the charged amount of any battery exceed the upper limit value and the lower limit value. In FIG. 3, as an example, a movable range when the central value of the charged amount is made to be the representative value, is expressed. Where in the movable range the present charged amount (star C) is positioned, is detected as a state of charge. For example, it is arranged that both ends of the movable range are 0% and 100%, and that the movable range is the full scale, the position of the charged amount on this scale is specified by ratio (percentage).

As shown at the lower portion in FIG. 3, the variation in charged amount enlarges as time elapses. If the change of variation and accompanying change in movable range are not considered, the state of charge can not properly be detected, as described above. According to the present invention, as shown in the figure, a variation after being enlarged is detected, and the movable range (A'~B') corresponding to the variation is found, and then, the state of charge is found.

The state of charge found in this way reflects the change of variation, and accurately shows the positioning of the charged amount in the present and actual movable range. Accordingly, if the charged amount and the charge and discharge are controlled by using the state of charge of the present invention, the charged amount can smoothly be changed in the movable range, on condition that the present and actual movable range are considered. Various types of problems caused by unconsidering the change of the variation, are dissolved.

Furthermore, on the basis of the detected value of the variation, control fully using the present and actual movable ranges becomes possible and wasteful narrowing of the movable range by estimating the variation to be large does not occur. Accordingly, the performance of a battery changing with the service time can be maximized.

Furthermore, in the present invention, the number of battery cells included in a battery block may be one. However, an advantage of device simplicity can be achieved by gathering a plurality of battery cells and treating them as one battery block. The number of batteries in each block may be equal or different.

Furthermore, a battery to which the present invention is applied, may be any type of battery. The battery is not limited to the example nickel hydrogen battery. The present invention can be applied to, for example, a lithium ion battery, a nickel cadmium battery, a lead battery, or the like. However, especially, the present invention is especially suitably applied to a battery in which the voltage value relative to the charged amount is constant in a wide range like a nickel hydrogen battery.

Furthermore, in the present invention, the movement of the charged amount (star mark) in the movable range in FIG. 3, is detected on the basis of, for example, the charge and discharge amount. This method is suitable for a type of battery such as said nickel hydrogen battery. However, not only this method but also any other method may be applied.

Furthermore, the present invention is suitably applied to the detection of the state of charge of a battery of a hybrid powered automobile. Moreover, the present invention can also similarly be applied to a battery of a normal electric motor car, or a battery used in a system other than an automobile.

Figure 4:
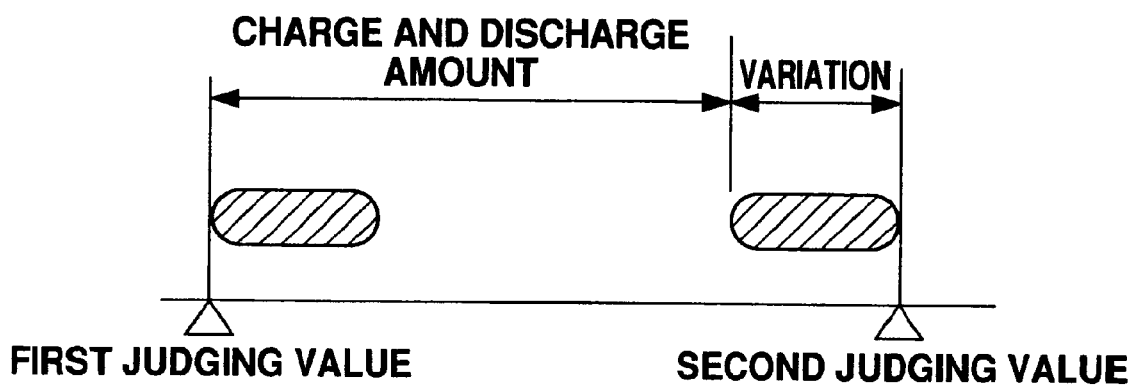
FIG. 4 is a figure explaining the detection of the variation in charged amount among batteries as the principle of the present invention.

FIG. 4 shows the principle of the detection of the variation in charged amount according to the present invention. When referring to FIG. 4, according to the present invention, the time when the charged amount of a battery block with the minimum charged amount has reached the first judgment value, is detected as the first judging time. Furthermore, the time when the charged amount of a battery block with the maximum charged amount has reached the second judgment value, is detected as the second judging time. Furthermore, the charge and discharge amount between the first judging time and the second judging time is measured. By subtracting the measured value of the charge and discharge amount from the width between the first judgment value and the second judgment value, the variation in charged amount among battery blocks can be found as shown in the figure. Previously, it has been necessary to know the charged amounts of all blocks for finding the variation in charged amount. On the contrary, according to the present invention, the variation in charged amount can easily be found even if the charged amounts of all blocks are not known.

Figure 1:
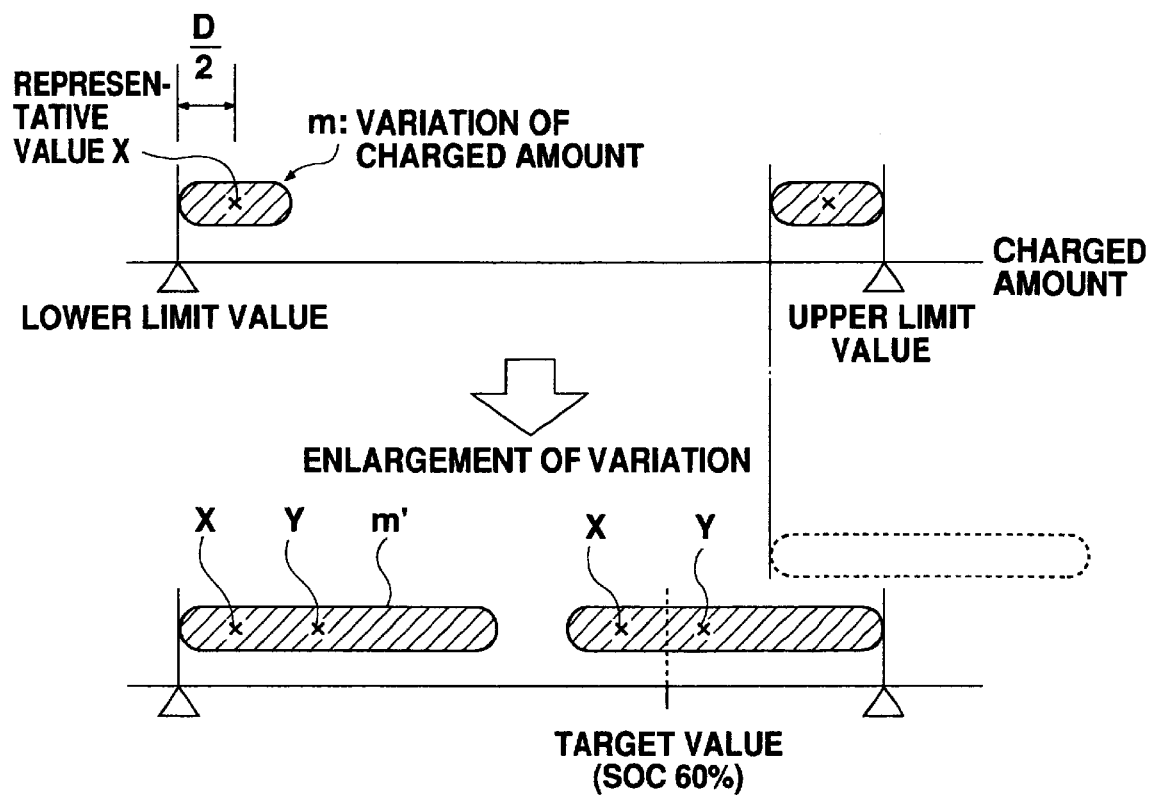
FIG. 1 is a figure for explaining a problem resulting in charge and discharge control when the change of the variation in charged amount is not considered.
Figure 2:
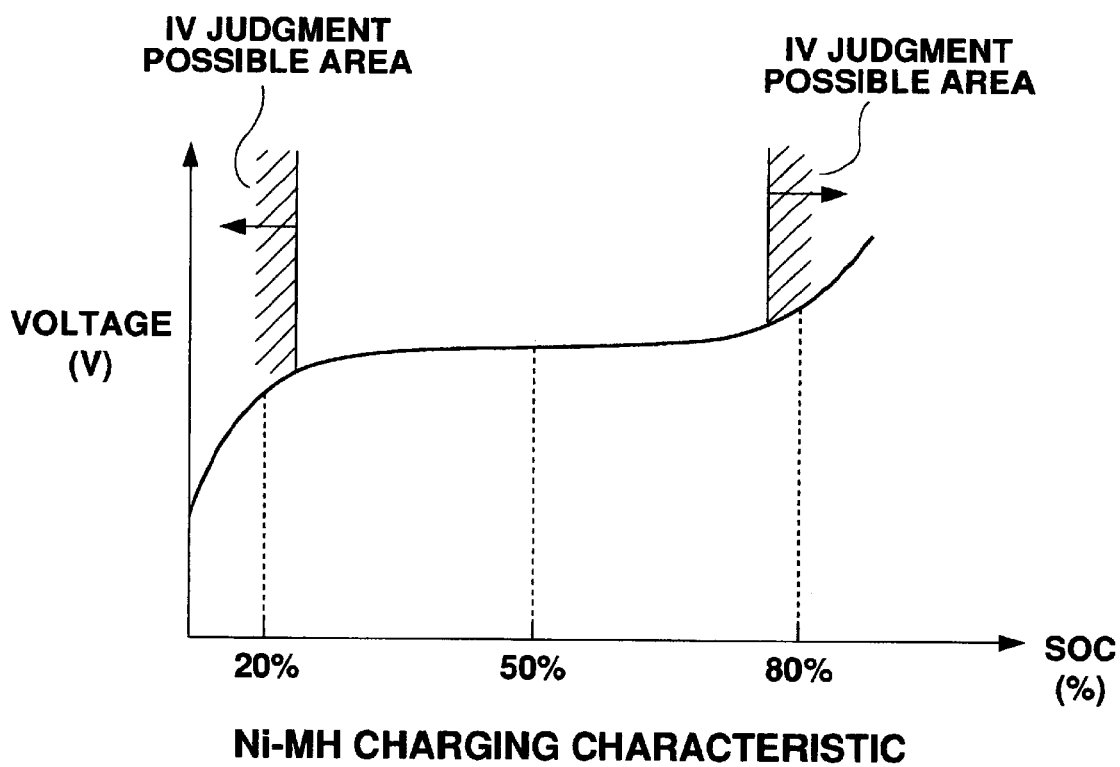
FIG. 2 is a figure showing the charging characteristic of a nickel hydrogen battery.

Especially, the present invention is suitably applied to a type of battery like a nickel hydrogen battery in which the voltage value relative to the charged amount is constant over a wide range. In this type of battery, since there is such a charging characteristic as shown in FIG. 2, the IV judgment as for the charged amounts of all batteries cannot be performed while the batteries are used. According to the present invention, the variation in charged amount is easily known by setting the first judgment value and the second judgment value in the area where the IV judgment is possible. Furthermore, it is a matter of course that the detecting method of the first and second judging times is not limited to the IV judgment.

Furthermore, either the first judging time or the second judging time may earlier be detected. It is also suitable to average a plurality of times of detection results. Furthermore, it is preferable that the first judging time and the second judging time are different as shown in the figure. Theoretically, the variation can be detected even if both are equal or even if the relation of the upper and lower sides between both is reverse.

<Embodiment 1>

Figure 5:
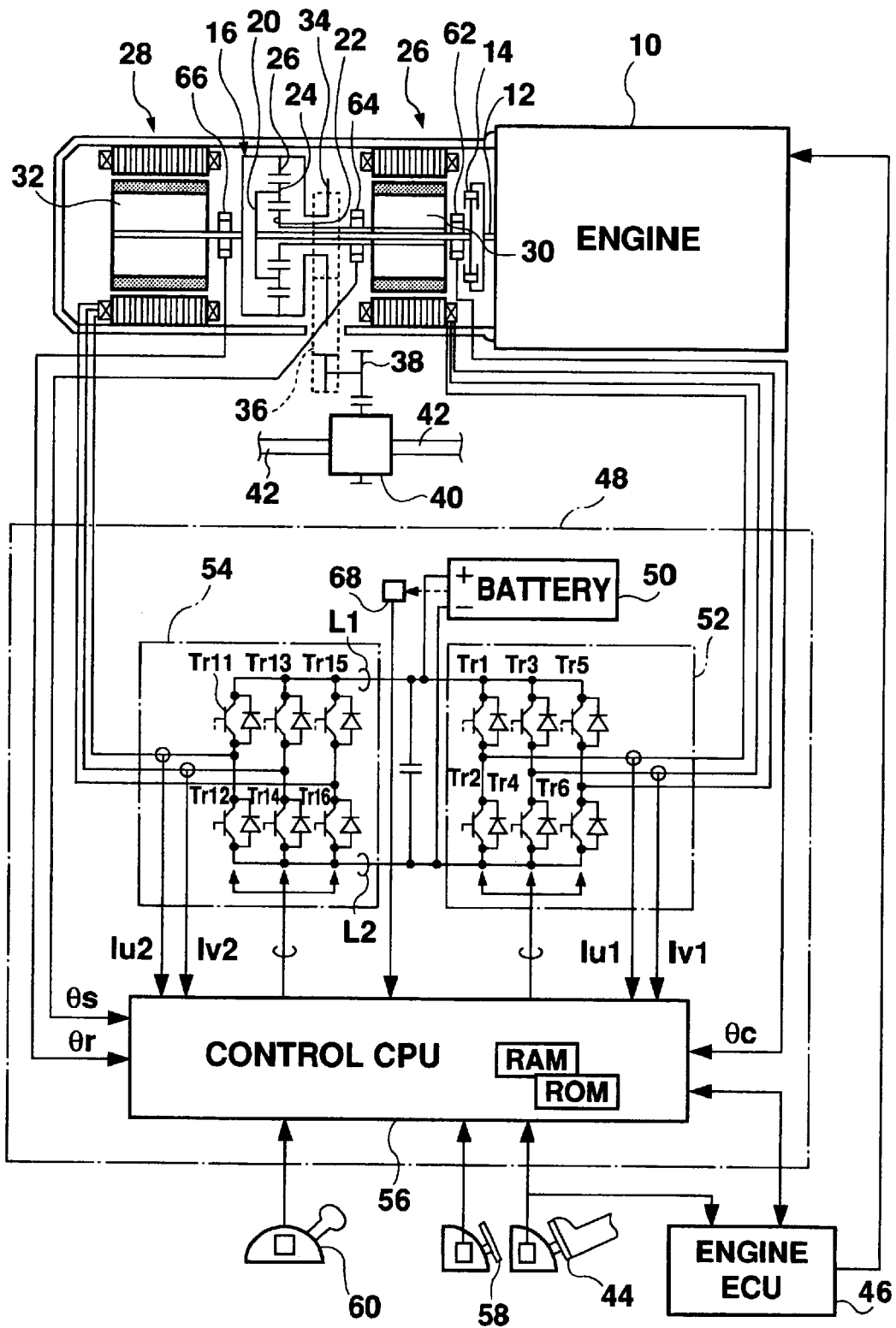
FIG. 5 is a figure showing the arrangement of a hybrid powered automobile of an embodiment of the present invention.

A preferred embodiment of the present invention will be described below illustrated by a specific example. In FIG. 5, a rough figure of a power plant of a vehicle to which a charge control device of the present invention is mounted is shown. To an output shaft 12 of an engine 10, a planetary carrier 20 supporting a planetary gear 18 of a planetary gear mechanism 16 is connected through a torsional damper 14. A sun gear 22 and a ring gear 24 of the planetary gear mechanism 16 are connected to rotors 30, 32 of a first motor-generator 26 and a second motor-generator 28, respectively. The first and second motor-generators 26, 28 function as a three-phase alternating current generator or a three-phase alternating current motor. To the ring gear 24, a power take out gear 34 is further connected. The power take out gear 34 is connected to a differential gear 40 through a chain 36 and a gear train 38. To the output side of the differential gear 40, a drive shaft 42 to the tip of which a driving wheel (not shown in the figure) is joined, is connected. By the above mentioned arrangement, the output power of the engine 10 or the first and second motor-generators 26, 28 is transmitted to the driving wheel, and drives the vehicle.

In the engine 10, the output power, the rotational speed, and the like are controlled by an engine ECU 46 on the basis of the manipulated variable of an accelerator pedal 44, the environmental conditions such as cooling water temperature or intake pipe negative pressure, and further, the operational states of the first and second motor-generators 26, 28. Furthermore, the first and second motor-generators 26, 28 are controlled by a control device 48. The control device 48 includes a battery (secondary battery) 50 which supplies the electric power to two motor-generators 26, 28 and receives the electric power from these. The exchanges of the electric power between the battery 50 and the first and second motor-generators 26, 28, are performed through a first inverter 52 and a second inverter 54, respectively. The control of two inverters 52, 54 is performed by a control CPU 56. This control is performed on the basis of the information of the operational state of the engine 10 from the engine ECU 46, the manipulated variable of the accelerator pedal 44, the manipulated variable of a brake pedal 58, the shift range determined by a shift lever 60, the state of charge of batteries, and further, the rotational angle θs of the sun gear, the rotational angle θc of the planetary carrier, the rotational angle θr of the ring gear of the planetary gear mechanism 16, or the like. Furthermore, the rotational angles of three components of said planetary gear mechanism 16 are detected by a planetary carrier resolver 62, a sun gear resolver 64, and a ring gear resolver 66, respectively. The electric power charged in batteries, that is, the charged amount is calculated by a battery ECU 68. The control CPU 56 controls transistors Tr1 to Tr6, Tr11 to Tr16 of the first and second inverters 52, 54, on the basis of the above mentioned conditions and u phase and v phase electric currents Iu1, Iv1, Iu2, Iv2 of the first and second motor-generators 26, 28, and further, electric currents L1, L2 supplied from or supplied to the batteries or the inverter on the other side, or the like.

The rotational speed Ns of the sun gear, the rotational speed Nc of the planetary carrier, and the rotational speed Nr of the ring gear of the planetary gear mechanism 16 have a relation shown by the following expression:

$$Ns = Nr - (Nr - Nc)(1+\rho)/\rho \qquad (1)$$

where ρ is the gear ratio between the sun gear and the ring gear. That is, if two of the three rotational speeds Ns, Nc, Nr are determined, the other one rotational speed is determined. The rotational speed Nr of the ring gear is determined by the speed of the vehicle, and therefore, if either rotational speed of the rotational speed Nc of the planetary carrier, that is, the rotational speed of the engine, or the rotational speed Ns of the sun gear, that is, the rotational speed of the first motor-generator, is determined, the other is automatically determined. Then field currents of the first and second motor-generators 26, 28 are controlled according to the rotational speed at each time, therefore, whether these motor-generators shall be operated as a generator or operated as a motor, is determined. If two motor-generators 26, 28 consume all generated electric power, further electric power is retrieved from the battery 50. If they generate electricity as a whole, the battery 50 is charged. For example, when a decrease in the charged amount of the battery 50 is detected by the battery ECU 68, power is generated by either or both of two motor-generators 26, 28 by using a part of the torque generated by the engine 10, and the charge to the battery 50 is performed. Furthermore, when the charged amount in the battery 50 is increased, the output power of the engine is restrained, and the second motor-generator 28 is operated as a motor, and the torque generated by this is controlled so as to be used for the running of the vehicle. Furthermore, during braking, either or both of the two motor-generators 26, 28 are operated, with the generated electric power being stored in the battery 50.

Since it is difficult to predict when automobile braking is performed, it is desirable that the battery 50 be in a state in which the electric power generated by the regenerative braking can readily be received. On the other hand, the battery 50 must ensure that a certain amount of charge is available for operating the second motor-generator 28 as a motor when the output power of the engine 10 alone cannot achieve an acceleration desired by the driver. In order to fulfill such condition, the charged amount of the battery 50 is controlled so as to be approximately one half of the battery capacity, that is, one half of the maximum electric power capable of being charged in the battery.

Especially, in a hybrid powered automobile in which the battery can be charged by performing the power generation with the output power of the engine, it is possible, by properly controlling the charged amount of a battery, to sufficiently recover the regenerative electric power during braking, raise energy efficiency, and achieve a desired acceleration. In other words, in a hybrid powered automobile, it is necessary to properly control the charged amount of a battery to increase energy efficiency and obtain a desired acceleration or the like.

Figure 6:
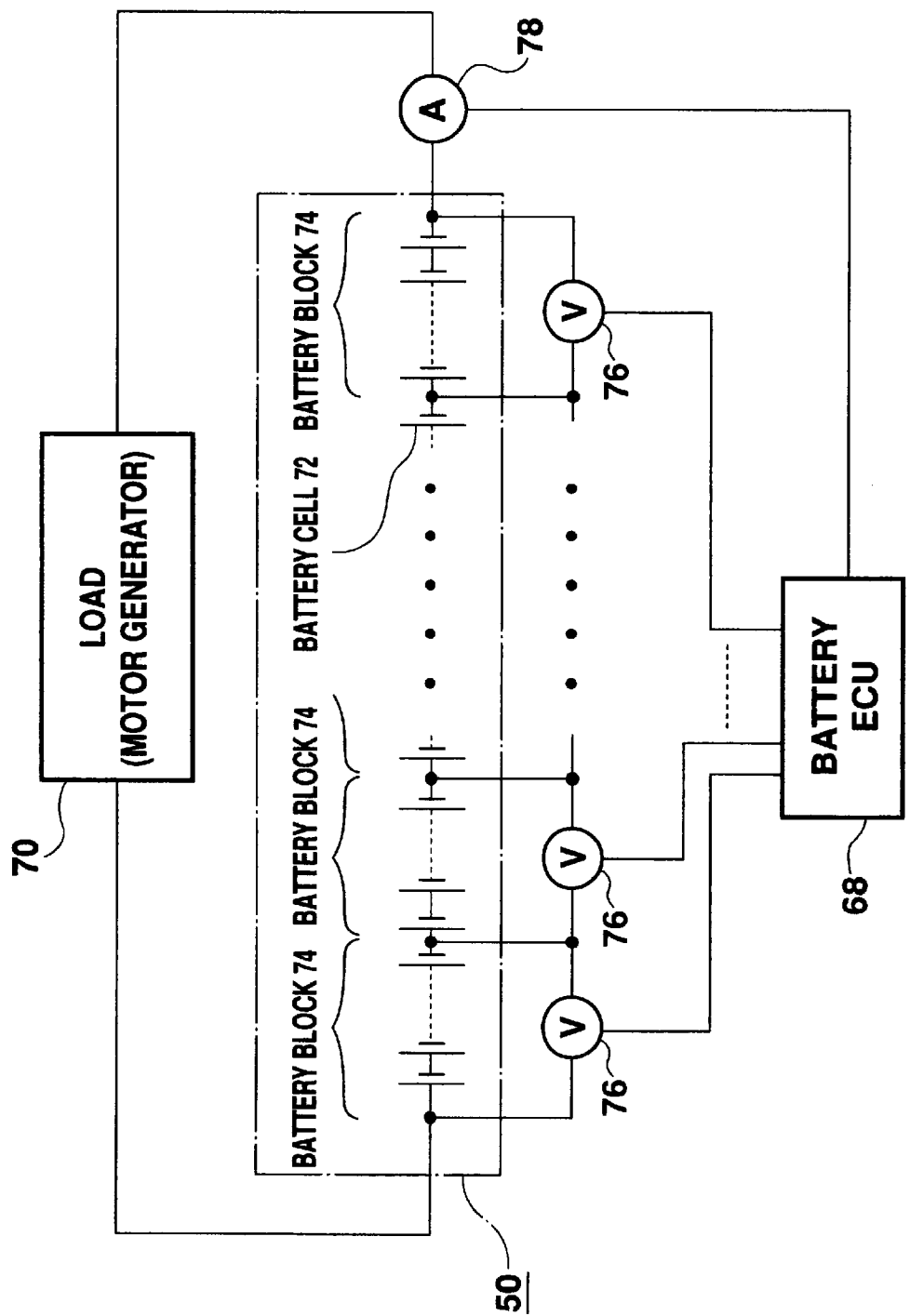
FIG. 6 is a figure showing the arrangement of a detecting device of the state of charge of the embodiment which is a part of the system in FIG. 5.

FIG. 6 shows a detecting device of the state of charge of the present embodiment, which is a part of the system in FIG. 5. A load 70 corresponds to motor-generators 26, 28 in FIG. 5, and is connected to the battery 50 through an inverter (not shown in the figure). The battery 50 is a battery assembly wherein a large number of battery cells 72 are connected in series. In the present embodiment, the battery cell 72 is a nickel hydrogen battery, and, in the battery assembly 50, 240 battery cells 72 are included. A group each including 12 pieces of battery cells 72 is treated as a battery block 74. That is, the battery assembly 50 comprises 20 battery blocks 74. The terminal voltage of each battery block 74 is detected by a voltage sensor 76 and output to the battery ECU 68. Furthermore, the value of the current flowing through the battery assembly is detected by a current sensor 78 and output to the battery ECU 68.

In the present embodiment, the upper limit value and the lower limit value of the charged amount are respectively set to 5.2 (AH) and 1.3 (AH). The amount of full charge of a nickel hydrogen battery is 6.5 (AH). Accordingly, said upper limit value and lower limit value respectively correspond to the conventional SOC 80% and SOC 20%. Furthermore, the numerical value of the charged amount when watched for each battery cell and the numerical value of the charged amount when watched as the total of a battery assembly, are the same.

This upper limit value, 5.2 AH is employed as a value up to which battery overheating or lowering of the charging efficiency from overcharge does not arise. Furthermore, the lower limit value, 1.3 AH is employed as a value down to which the electric power capable of starting up the engine by using a motor-generator can be ensured.

Furthermore, the upper and lower limit values are both set in the area where IV judgment is possible. The battery ECU 68 stores the IV characteristic line at the time when the charged amount is 1.3 AH and 5.2 AH. The IV characteristic line shows the relation between the terminal voltage of the battery block 74 and the value of the current flowing through the battery 50, for each charged amount. The battery ECU 68 performs the IV judgment by using the IV characteristic line on the basis of the input signals from the voltage sensor 76 and the current sensor 78. The battery ECU 68 detects, for each battery block 74, whether or not the charged amount of that block has reached the upper limit value or the lower limit value. On the basis of this detection result, when the charged amount of any one block has reached the upper limit value or the lower limit value, the charged amount is controlled so that further charge or discharge may not be performed. Thus, in the present embodiment, the normal control of the charged amount is performed on the basis of the state of charge, but, for final prevention of overcharge and over discharge, IV judgment is used.

Furthermore, the battery ECU 68 functions as a variation detecting means in the present invention and finds the variation in charged amount among battery blocks on the basis of said detected value of the voltage and detected value of the current. Furthermore, the battery ECU 68 functions as a movable range detecting means in the present invention and finds the amount of the state of charge on the basis of the detected value of the variation. The amount of the state of charge is a parameter expressing the charged amount of a battery assembly. The amount of the state of charge is N-SOC (to be described later) in the present embodiment, but it may also be another parameter in the scope of the present invention, or it may also be the charged amount itself.

Detection of the variation in charged amount

Figure 7:
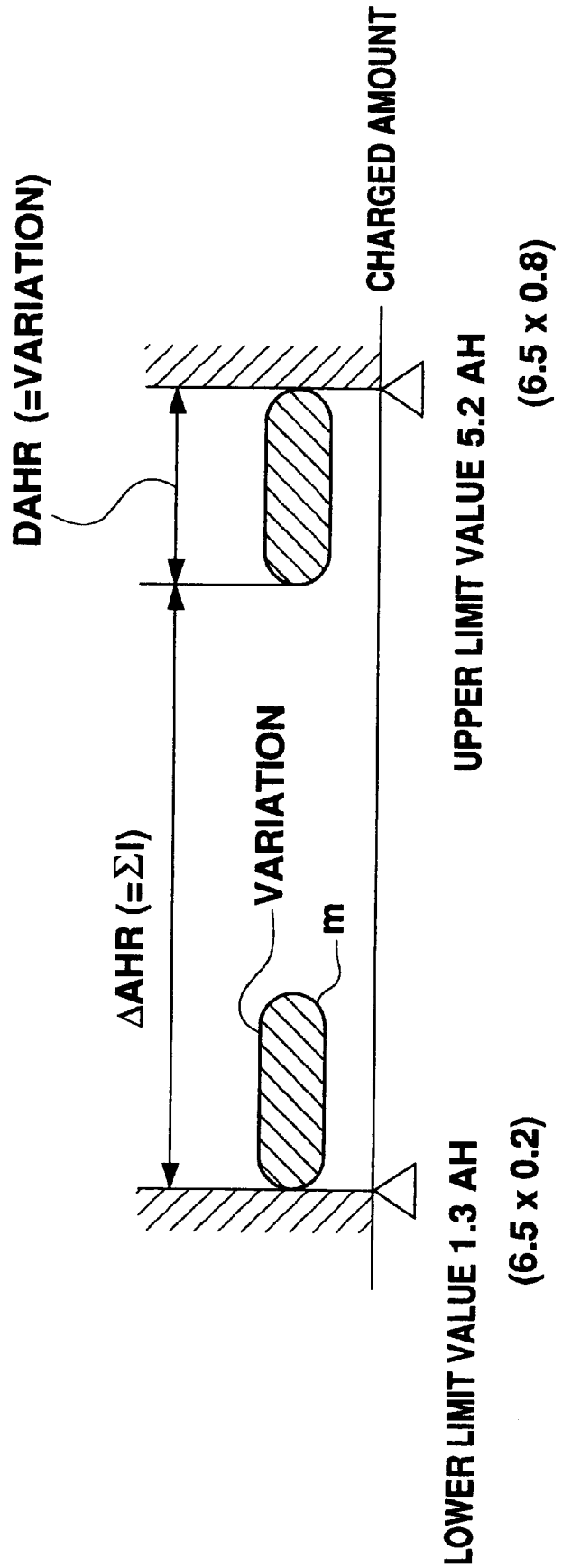
FIG. 7 is a figure showing the principle of the detection of the variation in charged amount by the device in FIG. 6.

FIG. 7 shows the principle of the detection of the variation here. When the discharge of a battery progresses, the charged amount moves leftward while keeping the variation (area m) in FIG. 7. When the left end of the area m has reached the lower limit value, the battery ECU 68 detects that the charged amount of a battery block 74 with the least charged amount has reached the lower limit value using IV judgment. This IV judgment is originally for the prevention of over discharge. In the present embodiment, the IV judgment at this time is utilized for the detection of the variation. The battery ECU 68 starts up the integration of the values of the current (I) input from the current sensor 78 at the time of the IV judgment.

Charge and discharge are next properly performed, and the charged amount moves rightward as a whole, while keeping the state of the variation. The integrated value is increased during charge, and is lowered during discharge. The charge further progresses, and it is detected that the charged amount of a block with the most charged amount has reached the upper limit value. By subtracting the integrated value of the current from the IV judgment of the lower limit value to the IV judgment of the upper limit value, from the width between the upper and lower limit values (3.9), the width of the variation in charged amount can be known, as shown in the figure.

Figure 8:
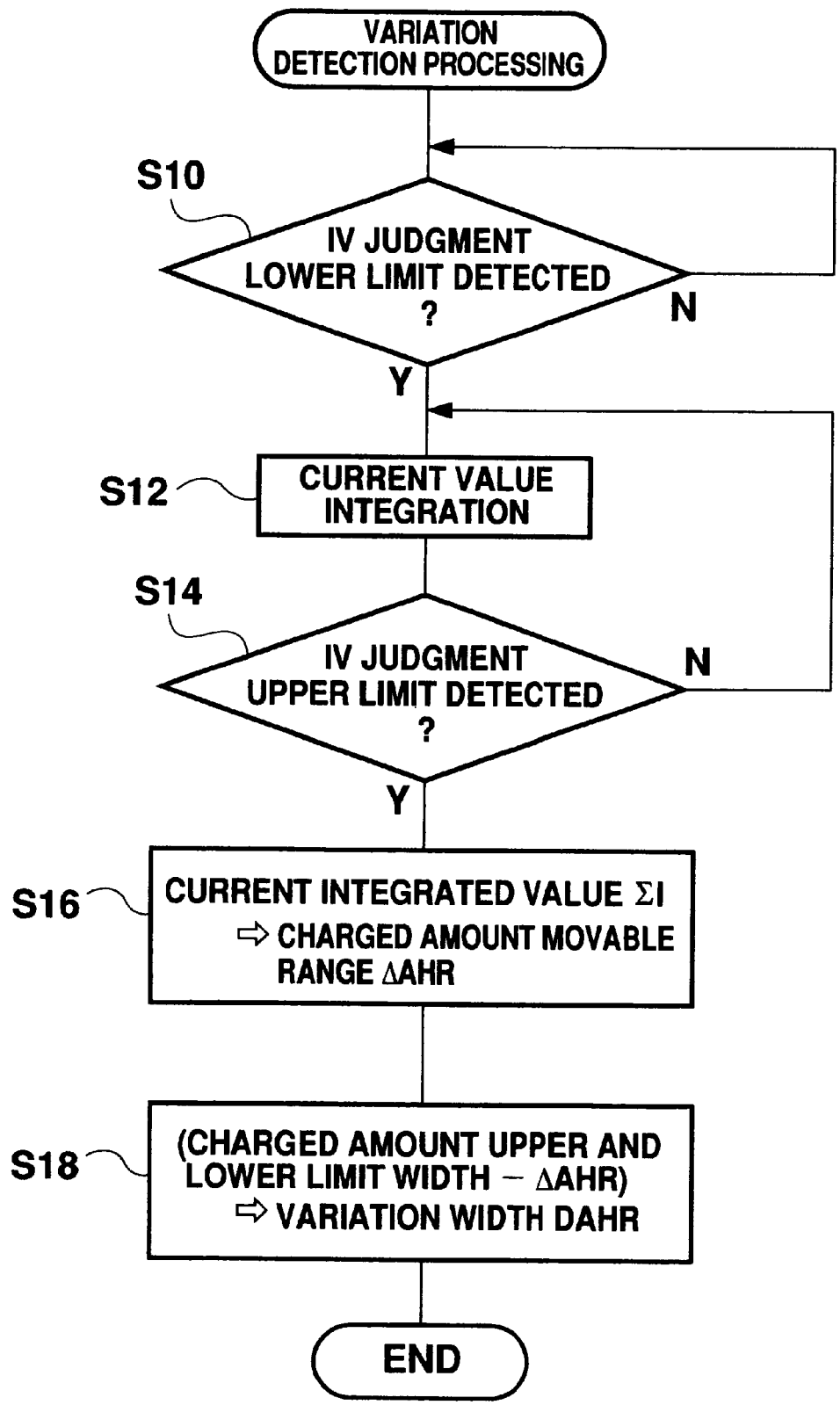
FIG. 8 is a flow chart showing the processing of the detection of the variation according to the principle in FIG. 7.

FIG. 8 is a flow chart showing the processing for said variation detection. The battery ECU 68 judges whether the IV judgment of the lower limit value has arisen or not (S10), and starts up the integration of the values of the current if the IV judgment has arisen (S12). The values of the current (I) are integrated in a specified memory area. The battery ECU 68 judges whether the IV judgment of the upper limit value has arisen or not (S14), and continues the integration, if NO. When the IV judgment of the lower limit arises again, the integration of the value of the current is reset. When the IV judgment of the upper limit value arises at S14, the integrated value of the current ($\Sigma I$) up to that time is set to the width of the movable range ($\Delta AHR$) of the charged amount (S16). It is clear from FIG. 7 that the integrated value of the current is equal to the width of the movable range. Furthermore, by subtracting $\Delta AHR$ from the width between the upper and lower limits of the charged amount, the width of the variation (DAHR) of the charged amount is calculated (S18).

Furthermore, the processing in said FIG. 7 and FIG. 8 is completely similarly realized, even when the IV judgment of the upper limit value is earlier than the IV judgment of the lower limit value. While the charged amount reciprocates between the upper limit value and the lower limit value, the detected values of the variation are obtained by turns. It is suitable to average detected values of the variation over a plurality of measurements.

Thus, according to the present embodiment, the IV judgment which is originally for the prevention of overcharge or over discharge, is utilized for the detection of the variation, and consequently, the variation in charged amount is easily and accurately detected. It is sufficient that the time when an IV judgment arises some time, is waited and the width of the variation is calculated, and it is unnecessary to dare to perform the charge and discharge or the like for the detection of the variation.

Detection of the state of charge

The battery ECU 68 detects the state of charge, as will be described below, on the basis of the variation in charged amount found as mentioned above. When referring to FIG. 9, the upper and lower limit values of the charged amount are set to 5.2 AH and 1.3 AH as mentioned above. The central value (× mark in the figure) of the scattering charged amounts is considered as the representative value X. Since the width of the variation in charged amount is DAHR, the movable range of the representative value X is, as shown in the figure, from "1.3+DAHR/2" to "5.2−DAHR/2".

Figure 9:
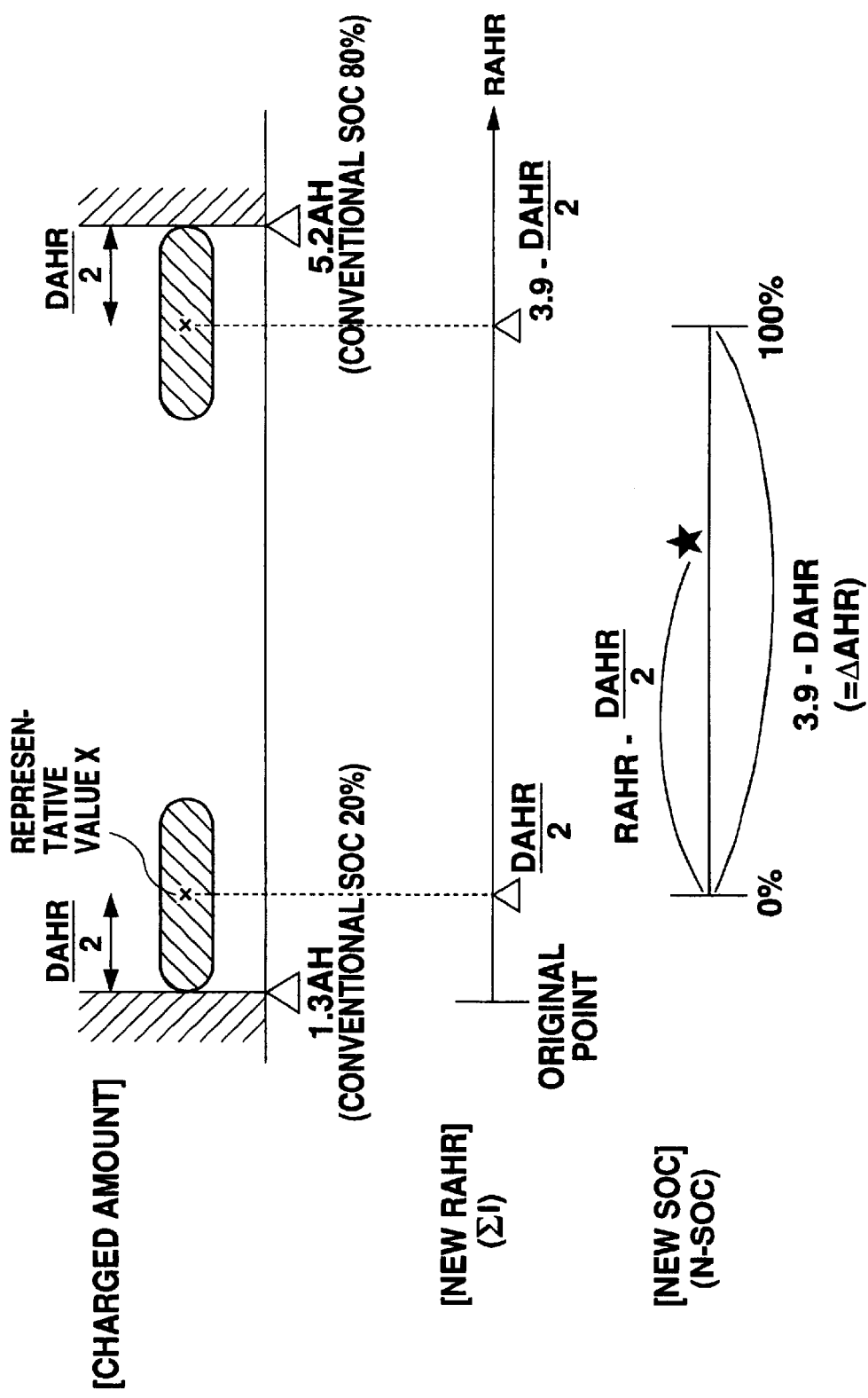
FIG. 9 is a figure showing the amount of the state of charge N-SOC detected by the device in FIG. 6.

As shown at the middle portion in FIG. 9, the numerical value, RAHR is defined. RAHR is an integrated value of the current input from the current sensor 76, and the unit thereof is AH similarly to the charged amount. RAHR is found by the battery ECU 68. RAHR at the time of the IV judgment of the lower limit value is made to be DAHR/2. RAHR at the time of the IV judgment of the upper limit value is made to be 3.9−DAHR/2. Accordingly, RAHR is a parameter expressing the charged amount found by the integration of the current, when letting the charged amount 1.3 AH be the reference value (original point). Furthermore, ΔAHR used for the detection of the variation in the above mentioned FIG. 7 is found from the amount of change of RAHR, in the internal processing of the battery ECU 68.

Next, the calculating expression of the new amount of the state of charge used in the present embodiment will be described. This amount of the state of charge is called new SOC, and is expressed by N-SOC. In the present embodiment, N-SOC's when the representative value of the charged amount is positioned at the left and right ends of the movable range, are respectively made to be 0% and 100%. That is, the movable range is the full scale. The position of the charged amount on this scale is shown by percentage. N-SOC is calculated by the following Expression (2):

$$N\text{-}SOC = \frac{RAHR - \frac{DAHR}{2}}{(3.9 - DAHR)} \times 100 \quad [\%] \qquad (2)$$

In Expression (2), the denominator is the width of the movable range of the charged amount (ΔAHR in FIG. 7). Furthermore, the numerator is the difference between the present RAHR and DAHR/2. DAHR/2 corresponds to RAHR when N-SOC is 0%. DAHR in said Expression (2) is changed when a new detected value of the variation is found. At this moment, the movable range of the charged amount is also changed and then the scale of N-SOC is also changed. Accordingly, even if the charged amount is the same, the value of N-SOC differs according to the change of the scale.

When referring to FIG. 5, the battery ECU 68 outputs N-SOC to the control CPU 58 as a parameter expressing the charged amount. The control CPU 58 controls the motor-generators 26, 28 so that N-SOC may be a proper value. In the present embodiment, the target value of N-SOC is set to 60%. The power plant in FIG. 4 is controlled so that the performance of a hybrid powered automobile may be pulled out to the utmost, considering the target value. At this time, the power plant control device functions as a charge and discharge control device properly controlling N-SOC, for the battery 50. Furthermore, the discharged electric power capable of being taken out is restricted according to the value of N-SOC, considering that the charged energy of a battery is limited.

N-SOC is properly used for another application necessary in a hybrid powered automobile. For example, it is used to tell the rest charged amount (rest capacity). The scale of N-SOC and the position of N-SOC on the scale are shown on an instrument panel.

Next, by referring to FIG. 10A to FIG. 10D, the transition of the charged amount when N-SOC of the present embodiment is applied, will be described. FIG. 10A and FIG. 10B show the control when the variation in charged amount is still small. The movable range (range between dotted lines) is found on the basis of the detected value of the variation, and N-SOC is controlled so that the charged amount may change in this range.

Furthermore, there is some error in RAHR because of the error of the current sensor or the miscalculation of the charging efficiency. This error is increased little by little with the elapse of time. This error is compensated at the time when the IV judgment is performed at an end portion of the movable range. The reason is that the charged amount is accurately detected by the IV judgment. By the compensation of RAHR, N-SOC is also automatically compensated.

FIG. 10C and FIG. 10D show the control when the variation in charged amount is enlarged. The full scale (that is, the movable range) of N-SOC is changed to be narrow on the basis of the detected value of the variation. N-SOC is controlled so as to be in place in this narrowed full scale. Of course, the compensation of RAHR at the time of the IV judgment is also performed here.

On the other hand, FIG. 11A to FIG. 11F show the transition of the detected value of the charged amount when the change of the variation is not considered. Here, a conventional SOC is applied to the control. The conventional SOC is the ratio of the occasional charged amount to the charged amount in the state of full charge. The conventional SOC is called C-SOC to distinguish it from N-SOC.

FIG. 11A and FIG. 11B show the control when the variation in charged amount is still small. When the width of the variation is equal to 10% of C-SOC, accordingly, the movable range of the representative value X of C-SOC is set from 25% to 75% (width=50%). C-SOC is controlled so as to be in place in the movable range. When IV judgment of the lower limit value or the upper limit value arises, C-SOC is set to 25% or 75% by compensation.

FIG. 11C and FIG. 11D show an unsuitable control when the variation is enlarged. When the IV judgment of the lower limit value arises, at this moment, since the change of the variation is not considered, the representative value X of C-SOC is compensated and is set to 25%. It is clear from the figure that this setting is inappropriate. Furthermore, charging is begun on the incorrect assumption that the movable range is equal to that in FIG. 11A. Then, by performing the integration of the current, C-SOC at each time is traced. However, since the actual movable range is narrow, the IV judgment of the upper limit value arises largely earlier than the expected time. At this moment, C-SOC is largely compensated and is set to 75%. The amount of compensation is an amount of a magnitude approximately corresponding to the difference between the width of the variation before enlargement and that after enlargement.

Such a large compensation arises because the movable range is falsely set because the change of the variation in charged amount is not considered. Accompanied with the large compensation of C-SOC, it becomes necessary to rapidly change the distribution of the driving force between the engine and the motor-generator, the output power is suddenly changed by stages, and a feeling of physical disorder is given to the occupants. In the present embodiment, as shown in FIG. 10C and FIG. 10D, the charge and discharge are controlled on the basis of the actual movable range, considering the change of the variation, and therefore, a large compensation does not arise. Accordingly, the arising of a feeling of physical disorder caused by a considerable compensation can be avoided.

Furthermore, as shown in FIG. 11E and FIG. 11F, the IV judgment line changes with the progress of the degradation of a battery proceeds, and there is such a tendency that the IV judgment of the upper limit or the lower limit arises in the early stage. For example, when the amount of C-SOC is still 30%, C-SOC 20% is detected through IV judgment. Using such a judgment in the early stage, an effect similar to the enlargement of the variation in charged amount arises, that is, the movable range is apparently narrowed because the IV judgment is performed earlier than the expected time. Consequently, a considerable compensation of C-SOC arises similarly to the above description. However, the present embodiment can also effectively deal with such a phenomenon. If N-SOC of the present embodiment is applied, the movable range and the scale of N-SOC used for the control are also changed according to said apparent narrowing of the movable range. Accordingly, such a considerable compensation as shown in FIG. 11F does not arise. Furthermore, a considerable compensation of C-SOC may also arise by the so-called memory effect. The memory effect is such a phenomenon that it becomes difficult for the electric power in the state of charge to be discharged because of the over charge to a battery or the like. The present embodiment can also similarly deal with this memory effect, and the arising of a considerable compensation of the charged amount is avoided by the application of N-SOC of the present embodiment.

Furthermore, in the case of a control in which the change of the variation is not considered as shown in FIG. 11A to FIG. 11F, it is difficult to bring the central value of the actual C-SOC to the control target value because the representative value X is largely shifted from the central value of the charged amount. On the other hand, in the present embodiment, N-SOC expresses the accurate position of the central value of the charged amount at all times. Accordingly, N-SOC 60% which is the control target value, can easily be achieved with surety. Contradictions on the control that the IV judgment arises before the achievement of the control target do not arise, and the accompanying hunting phenomenon is also eliminated.

A preferred embodiment of the present invention has been described above. As mentioned above, in the present embodiment, the variation in charged amount of a battery block can easily be detected, even if a battery assembly is mounted on a hybrid powered automobile to be used. Then, by the application of N-SOC based on the detected value of the variation, the detection of the charged amount is suitably performed, and the charge control is properly performed.

Furthermore, in the present embodiment, as shown in FIGS. 10A to 10D, the actual movable range at each time can be fully utilized. Accordingly, there is such an advantage that the charging capacity of a battery can sufficiently be utilized.

Furthermore, the present invention can be applied to a battery other than a nickel hydrogen battery. However, the present invention is especially preferably applied to a battery (refer to FIG. 2) such as a nickel hydrogen battery, in which the voltage value relative to the charged amount is constant in a wide range. The reason is that the detection of the charged amount based on the integrated value of the current is effectively utilized since the IV judgment in the total area of the charged amount is impossible.

Furthermore, the present invention can also be applied to an electric motor car other than a hybrid powered automobile. However, in a common electric motor car, discharge is mainly performed during the running. On the other hand, in a hybrid powered automobile, as shown in FIG. 10 or FIG. 11, the charged amount is controlled by the charge and discharge, and further, the control to achieve the target value of the charged amount is performed. In the control of a hybrid powered automobile like this, the present invention especially suitably functions.

<Embodiment 2>

In said Embodiment 1, it is detected by the IV judgment that the charged amount of one battery block 74 has reached the upper limit value and the lower limit value. However, when a battery is in a state of high temperature or in a state of low temperature, the judging accuracy of the IV judgment is low. If the result of an IV judgment in such a state of temperature is used, the error in the detected value of the variation in charged amount or the detected value of the movable range also becomes large. Therefore, in Embodiment 2, the battery temperature during IV judgment is obtained, and, by referring to this battery temperature, the detecting accuracy of the variation or the movable range is improved.

The arrangement of Embodiment 2 is similar to the arrangement of Embodiment 1 shown in FIG. 5 and FIG. 6. However, in Embodiment 2, any type of battery temperature sensor (not shown in the figure) for detecting the temperature of the battery 50, is provided near the battery 50 in FIG. 6. Only one battery temperature sensor may be provided for the battery 50, but it is also possible to provide a plurality of battery temperature sensors so that the temperature of each battery block 74 may individually be detected. It is further possible that the temperature of each battery cell 72 may individually be detected. Thus, the number and the position of battery sensors can be determined at will. The detected value of the battery temperature sensor is input into the battery ECU 68.

As described by referring to FIG. 7 and FIG. 8, the battery ECU 68 performs IV judgment for the detection of the variation in charged amount. That is, it is detected through IV judgment that the charged amount of a battery block 74 with the least charged amount has reached the lower limit value (1.3 AH). Furthermore, it is detected through IV judgment that the charged amount of a battery block 74 with the most charged amount has reached the upper limit value (5.2 AH). When these IV judgments are found, the battery ECU 68 refers to the detected battery temperature value, and judges whether or not the detected value of the temperature of a battery is in a specified range of allowable temperature. The upper limit value and the lower limit value of this specified range of allowable temperature are respectively set on the basis of the battery temperature at which the IV judgment can be performed with an allowable accuracy. For a battery temperature outside of the range of allowable temperature, the accuracy of the IV judgment is lowered by a significant amount.

If the battery temperature is in said range of allowable temperature during the IV judgments of both the upper limit value and the lower limit value, the variation in charged amount can be found similarly to Embodiment 1. Then, on the basis of the detected width of the variation, the amount of the state of charge of the present invention (N-SOC) is calculated, control of charge and discharge of the battery 50 is performed based on that N-SOC.

On the other hand, if the battery temperature is not in said range of allowable temperature during the IV judgment of at least either of the upper limit value or the lower limit value, the calculation of the width of the variation by using the integrated value of the current, and the calculation of the movable range based on the width of the variation are not performed. Since these numerical values are not renewed, the previously detected and used width of the variation and movable range (existing values) are continuously used. If an IV judgment in said range of allowable temperature arises after that, the variation and the movable range are renewed.

Figure 12:
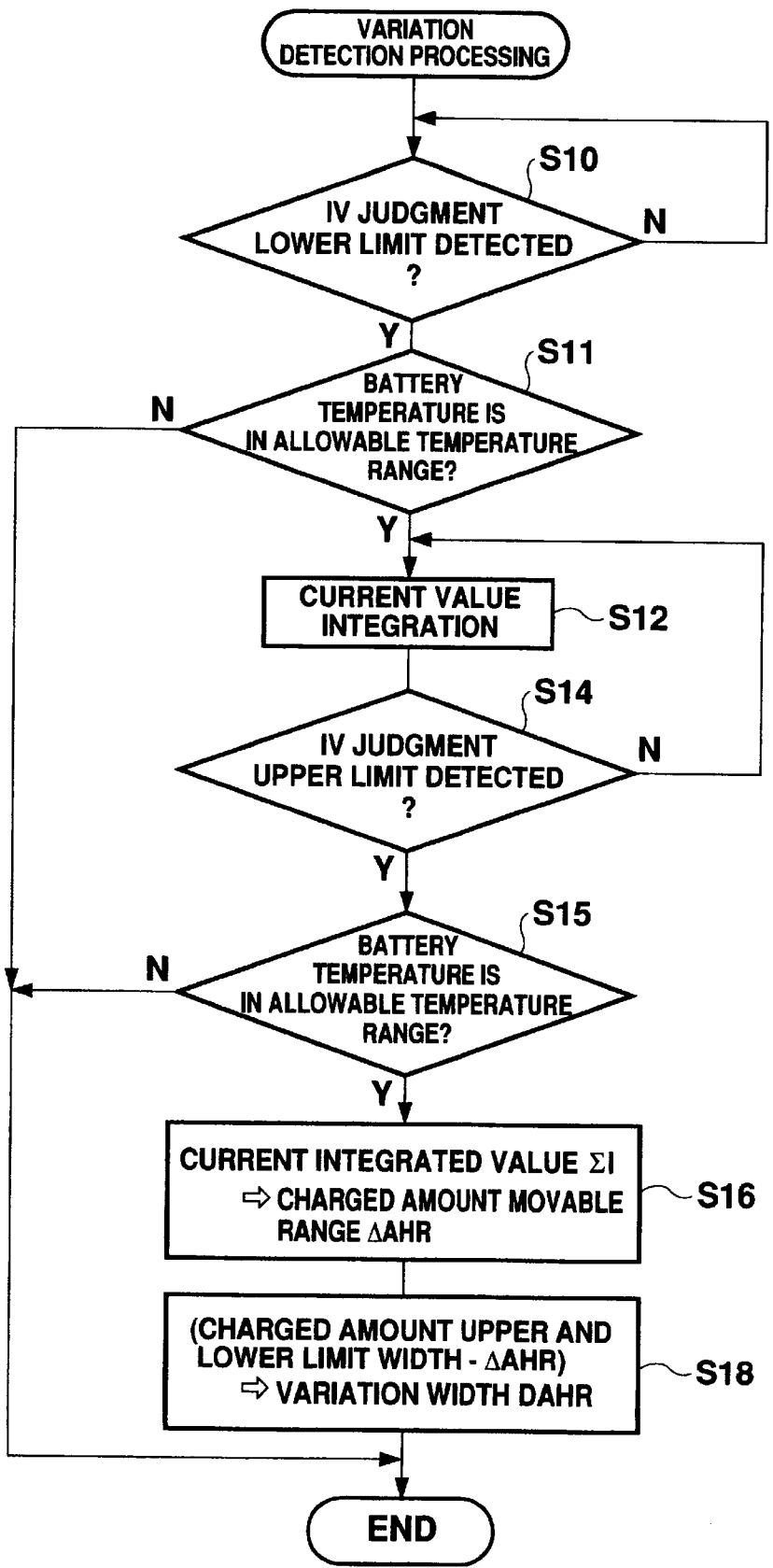
FIG. 12 is a flow chart showing the processing of the detection of the variation of an Embodiment 2 of the present invention.

FIG. 12 is a flow chart showing a variation in detection processing of Embodiment 2. For steps corresponding to those in the processing shown in FIG. 8, corresponding labels have been given. In Embodiment 2, as shown in the figure, the step S11 and the step S15 are added as compared with FIG. 8. When the IV judgment at S10 arises, the battery ECU 68 judges whether the battery temperature is in the range of allowable temperature or not (S11), and if YES, the process advances to S12, but if NO, it finishes the processing. Furthermore, when the IV judgment at S14 arises, the battery ECU 68 also similarly judges whether the battery temperature is in the range of allowable temperature or not (S15), and if YES, it advances to S16, but if NO, the processing is ended.

Furthermore, in the arrangement in which the battery temperature of each battery block 74 is individually detected, it is considered to be suitable that the judgment of S11 or S15 is performed on the battery temperature of a battery block 74 in which the IV judgment has arisen.

Furthermore, in the above description, a case where the IV judgment of the lower limit value arises earlier and the IV judgment of the upper limit value arises later, is described. It should be noted that, even if the order of the upper limit value and the lower limit value is reversed, the description remains the same.

As described above, in Embodiment 2, since the calculation of the variation in charged amount or the movable range is not performed in the range of temperature where the accuracy of the IV judgment is low, the accuracy of the calculation of these numerical values can be improved.

<Embodiment 3>

Since there are errors in the IV judgment or the integration of the current used in Embodiment 1, the variation in charged amount or the movable range may be estimated to be less than the actual amounts because of those errors. In such a case, the charged amount is controlled so that N-SOC may fluctuate in the movable range estimated to be less. Accordingly, the whole of the actual movable range is not utilized, and the performance of a battery cannot completely be utilized. Furthermore, the fact that N-SOC fluctuates in the movable range estimated to be less, means that thereafter it is difficult for the IV judgment of the upper limit value or the lower limit value to arise and the reobtaining of the variation in charged amount or the movable range is not performed. Accordingly, a state where battery performance is wasted may continue.

Furthermore, the performance of a battery is largely affected by the service environments (temperature and area). Accordingly, variation in charged amount and the movable range change with, for example, the season. Furthermore, if the service area of a hybrid powered automobile changes (for example, the vehicle is moved from a cold area to a warm area), the variation in charged amount and the movable range are changed with the change in climate. In such a case that the movable range is enlarged by the change of the environment, a phenomenon equal to that when the movable range is estimated to be less arises, and the battery does not perform sufficiently.

In Embodiment 3, in order to avoid such a situation that the total of the movable range cannot be used as mentioned above, the battery ECU 68 performs the following control:

The battery ECU 68 first detects the variation in charged amount by performing the IV judgments of the upper limit value and the lower limit value, as described in Embodiment 1. From this detected value of the variation, the movable range is calculated. The scale of the movable range is, as shown by FIG. 10 and Expression (2), 3.9−DAHR (AH). Here, DAHR is a detected value of the width of the variation in charged amount. Then, on the basis of this movable range, N-SOC at each time is calculated according to Expression (2).

As a feature of Embodiment 3, the battery ECU 68 gradually enlarges said detected movable range with the elapse of time. This enlargement means the recovery of the movable range. Accompanied with the enlargement, the variation DAHR is reduced. The processing of enlargement is performed so that the width of the movable range may be increased at a specified speed, that is, by a specified width at a specified timing.

If there is such an error that the movable range is estimated to be less, the error is corrected by the enlargement of the movable range. Then, if the movable range is enlarged beyond the actual width, the IV judgment arises some time. If the IV judgments of both the upper and lower limit values arise, the variation is detected, and the movable range is renewed. Then, starting from the renewed movable range, the processing of enlargement of the movable range begins again.

The battery ECU 68 cannot judge whether the estimation of the movable range is correct or not. Therefore, even if the movable range is correctly estimated, the movable range is enlarged similarly to the above description. It is considered that the next IV judgment arises at a comparatively early time since the movable range is enlarged. The next detection of the variation is begun by this IV judgment.

Furthermore, if the movable range enlarges too swiftly, there is a possibility that the frequency of the IV judgment is increased so that the drivability may be affected. On the contrary, if the speed of enlargement is too small, the effect of the error of the movable range remains for a long time. The speed of enlargement of the movable range is set considering these points and according to the specifications of the battery and the total of the power plant system.

Furthermore, the movable range may be enlarged to the side of increasing of the charged amount (right side in FIG. 9), may be enlarged to the side of decreasing of the charged amount (left side in FIG. 9), or may be enlarged to both sides. It is supposed that the IV judgment of the lower limit value arises, and after that, the IV judgment of the upper limit value arises, and then, the movable range is renewed. In this case, it is considered to be suitable that the movable range is enlarged downward. This is a case where the IV judgments are performed in the order shown in FIG. 8 as an example. On the contrary, in a case where the IV judgments arise in the order of the upper limit value and the lower limit value, it is considered to be preferable that the movable range is enlarged upward.

Furthermore, as another feature of the present embodiment, the maximum value of the movable range is set in the control of enlargement of the movable range. If the movable range is gradually enlarged and the width thereof reaches said maximum value, further enlargement is prohibited. Consequently, an excessive enlargement of the movable range is avoided, and the degradation of the drivability caused by utilizing the movable range estimated to be large for the control, is avoided. In the present embodiment, the maximum value of the width of said movable range is set to 3.9 (AH). The value is 60% (80%−20%), when converted into a conventional type of amount of the state of charge (C-SOC). The reason is that the movable range cannot exceed 3.9 (AH). When the movable range reaches this maximum value, the movable range is clamped.

As described above, in Embodiment 3, by the control of enlargement of the movable range, the movable range used for the control can be brought near the real movable range, and the performance of a battery can more sufficiently be pulled out. Furthermore, by setting the maximum value of the movable range, an excessive enlargement is avoided and a proper control is performed.

Furthermore, it is also preferable to provide the arrangement of Embodiment 2 and the arrangement of Embodiment 3 in one system.

While there have been described what are at present considered to be preferred embodiments of the invention, it will be understood that various modifications may be made thereto, and it is intended that the appended claims cover all such modifications as fall within the true spirit and scope of the invention.

What is claimed is:

1. A method for detecting the state of charge of a battery assembly with a plurality of battery cells connected in series, comprising the steps of:

detecting a variation in charged amount among a plurality of battery blocks composing said battery assembly and including one or more battery cells in each block;

calculating a movable range of the charged amount on the basis of a detected value of the variation and an upper limit value and a lower limit value of the charged amount of said battery blocks; and detecting a state of charge showing where in said movable range the present charged amount is positioned.

2. A device for detecting the state of charge of a battery assembly with a plurality of battery cells connected in series, comprising:

a variation detecting means for detecting a variation in charged amount among a plurality of battery blocks composing said battery assembly and including one or more battery cells in each block; and a movable range calculating means for calculating a movable range of the charged amount on the basis of a detected value of the variation and an upper limit value and a lower limit value of the charged amount of said battery blocks, wherein the position of the present charged amount within said movable range, is detected as a state of charge.

3. The state of charge detecting device according to claim 2, wherein, when said movable range is made to be the full scale, a ratio of the charged amount on a scale to the full scale is found as the state of charge.

4. The state of charge detecting device according to claim 2, wherein said variation detecting means comprises:

means for detecting a first judging time, which is the time when the charged amount of a battery block having the minimum charged amount has reached a first judgment value;

means for detecting a second judging time, which is the time when the charged amount of a battery block having the maximum charged amount has reached a second judgment value;

charge and discharge amount measuring means for measuring the amount of charge and discharge between the first judging time and the second judging time; and variation calculating means for calculating a variation in charged amount among battery blocks on the basis of the first judgment value and the second judgment value and a measured value of the amount of charge and discharge.

5. A device for detecting a state of charge of a battery assembly which can detect a variation in charged amount among a plurality of battery blocks composing the battery assembly and including one or more battery cells in each block, comprising:

means for detecting a first judging time, which is the time when the charged amount of a battery block having the minimum charged amount has reached a first judgment value;

means for detecting a second judging time, which is the time when the charged amount of a battery block having the maximum charged amount has reached a second judgment value;

charge and discharge amount measuring means for measuring the amount of charge and discharge between the first judging time and the second judging time; and variation calculating means for calculating a variation in charged amount among battery blocks on the basis of the first judgment value and the second judgment value and a measured value of the amount of charge and discharge.

6. The state of charge detecting device according to claim 5, further comprising a temperature detecting means for detecting battery temperature, wherein the calculation of a variation in said charged amount by using said measured value of the amount of charge and discharge, is prohibited, in a case where the battery temperature at least at either time of said first judging time or said second judging time, is not in a specified range of temperature.

7. A charge and discharge control device for a battery assembly comprising a plurality of battery cells connected in series, comprising:

variation detecting means for detecting a variation in charged amount among a plurality of battery blocks composing said battery assembly and including one or more battery cells in each block; and movable range calculating means for calculating a movable range of the charged amount, on the basis of a detected value of the variation and an upper limit value and a lower limit value of the charged amount of said battery blocks, wherein said control device controls the amount of charge and discharge to the battery assembly so that the charged amount may be in said movable range.

8. The charge and discharge control device according to claim 7, wherein said variation detecting means further comprises:

means for detecting a first judging time, which is the time when the charged amount of a battery block having the minimum charged amount has reached a first judgment value;

means for detecting a second judging time, which is the time when the charged amount of a battery block having the maximum charged amount has reached a second judgment value;

charge and discharge amount measuring means for measuring the amount of charge and discharge between the first judging time and the second judging time; and variation calculating means for calculating a variation in charged amount among battery blocks on the basis of the first judgment value and the second judgment value and a measured value of the amount of charge and discharge.

9. The charge and discharge control device according to claim 7, wherein the movable range of said charged amount calculated by said movable range calculating means is enlarged by a specified timing after the calculation.

10. The charge and discharge control device of a battery assembly according to claim 9, wherein, during the enlargement of the movable range of said charged amount, the size of said movable range is restricted so as not to exceed a specified maximum value.

11. A charge and discharge control device for a battery assembly comprising a plurality of battery cells connected in series, comprising:

judging means for judging whether or not the charged amount has reached an upper limit value or a lower limit value, for each of a plurality of battery blocks composing said battery assembly and including one or more battery cells in each block; and movable range calculating means for finding the movable range of the charged amount, which is the range of the charged amount between the state when the charged amount of a battery block having the minimum charged amount has reached the lower limit value and the state when the charged amount of a battery block having the maximum charged amount has reached the upper limit value, wherein said control device controls the amount of charge and discharge to the battery assembly so that the charged amount may be in said movable range.

12. The charge and discharge control device according to claim 11, comprising:

an ammeter for detecting a current flowing through a battery assembly; and a voltmeter for measuring a voltage of each battery block, wherein said judging means judges that the charged amount of a battery block has reached the upper limit value or the lower limit value, by the IV judgment based on a detected value of the current and a detected value of the voltage.

13. The charge and discharge control device according to claim 12, wherein where in said movable range the charged amount is positioned, is calculated, on the basis of the amount of charge and discharge found by accumulating the detected values of the current.

14. The charge and discharge control device according to claim 13, wherein the battery cell composing said battery assembly is a nickel hydrogen battery, and wherein the upper limit value and the lower limit value of the charged amount are set in the area where the amount of change of the voltage relative to the charged amount is not constant and said IV judgment can be performed suitably.

15. The charge and discharge control device according to claim 11, further comprising temperature detecting means for detecting battery temperature, and wherein the calculation of the movable range of said charged amount is prohibited when the battery temperature is not in a specified range of temperature during the judgment by said judgment means.

16. The charge and discharge control device according to claim 11, wherein the movable range of said charged amount calculated by said movable range calculating means is enlarged by a specified timing after the calculation.

* * * * *